(12) United States Patent
Herd et al.

(10) Patent No.: US 10,908,214 B2
(45) Date of Patent: Feb. 2, 2021

(54) BUILT-IN SELF-TEST IN A DATA PROCESSING APPARATUS

(71) Applicant: Arm Limited, Cambridge (GB)

(72) Inventors: Joseph Samuel Herd, Stevenage (GB); Kar-Lik Kasim Wong, Wokingham (GB); Christopher Vincent Severino, Haverhill (GB)

(73) Assignee: Arm Limited, Cambridge (GB)

( * ) Notice: Subject to any disclaimer, the term of this patent is extended or adjusted under 35 U.S.C. 154(b) by 40 days.

(21) Appl. No.: 16/289,741

(22) Filed: Mar. 1, 2019

(65) Prior Publication Data
US 2020/0278395 A1    Sep. 3, 2020

(51) Int. Cl.
| | | |
|---|---|---|
| *G01R 31/00* | (2006.01) | |
| *G01R 31/3185* | (2006.01) | |
| *G01R 31/3177* | (2006.01) | |
| *G06F 9/4401* | (2018.01) | |
| *G01R 31/317* | (2006.01) | |

(52) U.S. Cl.
CPC .  *G01R 31/318575* (2013.01); *G01R 31/3177* (2013.01); *G01R 31/31721* (2013.01); *G01R 31/31724* (2013.01); *G01R 31/31727* (2013.01); *G06F 9/4401* (2013.01)

(58) Field of Classification Search
None
See application file for complete search history.

(56) References Cited

U.S. PATENT DOCUMENTS

| | | | | |
|---|---|---|---|---|
| 2005/0218952 A1* | 10/2005 | Padhye | ................. | G11C 5/147 327/218 |
| 2010/0318843 A1* | 12/2010 | Singh | ..................... | G11C 29/44 714/6.12 |
| 2011/0022826 A1* | 1/2011 | More | ....................... | G06F 1/26 713/1 |
| 2014/0075257 A1* | 3/2014 | Wang | ...................... | G06F 30/30 714/731 |
| 2014/0122833 A1* | 5/2014 | Davis | ..................... | G06F 13/102 712/29 |
| 2018/0164376 A1* | 6/2018 | Ge | .................... | G01R 31/31721 |
| 2019/0187770 A1* | 6/2019 | Severino | ................ | G06F 1/3287 |
| 2019/0265983 A1* | 8/2019 | Pontes | ................. | G06F 9/44505 |

OTHER PUBLICATIONS

A. Hazra, S. Goyal, P. Dasgupta and A. Pal, "Formal Verification of Architectural Power Intent," in IEEE Transactions on Very Large Scale Integration (VLSI) Systems, vol. 21, No. 1, pp. 78-91, Jan. 2013, doi: 10.1109/TVLSI.2011.2180548. (Year: 2013).*

* cited by examiner

*Primary Examiner* — Daniel F. McMahon
(74) *Attorney, Agent, or Firm* — Nixon & Vanderhye P.C.

(57) ABSTRACT

An apparatus has a control domain comprising functional circuitry to perform logical operations when in an operational state. The functional circuitry comprises at least one output and a state of the output depends on the logical operations. Domain control circuitry controls the control domain to put the functional circuitry in one of the operational state and a non-operational state. Isolation circuitry isolates the functional circuitry within the apparatus by holding the state of the output at a predetermined value when the domain control circuitry puts the functional circuitry in the non-operational state. Self-test control circuitry causes the domain control circuitry to control the control domain to put the functional circuitry in the non-operational state and to cause a self-test procedure to be carried out with respect to the functional circuitry.

18 Claims, 12 Drawing Sheets

BUILT-IN SELF-TEST IN A DATA PROCESSING APPARATUS

TECHNICAL FIELD

The present disclosure relates to data processing. In particular, the present disclosure relates to built-in self-test in a data processing apparatus.

DESCRIPTION

In addition to the testing which is carried out when a contemporary data processing apparatus, such as a system-on-chip (SoC), is manufactured, the system itself may be provided with built-in self-test (BIST) capability in order to detect faults which may develop over time in operation. In order to support such BIST capability a data processing apparatus can be provided with dedicated self-test control circuitry which is provided in addition to the functional circuitry which makes up the data processing apparatus itself. For example in the context of a SoC constructed by electronic design automation (EDA) processes, EDA tools may be used to additionally add BIST capability in the SoC being designed, in order to enable the SoC to perform BIST once the SoC is operational, i.e. in a live system. When such BIST is to be carried out in a live system, the logic to be tested must be isolated from other functionally operational logic in the system to prevent interference caused by spurious outputs of the logic under test interacting with that other functionally operational logic. For this purpose guard cells (also referred to as isolation cells) may be inserted as part of the design process, where these guard cells are placed at the periphery of logic which is to be the subject of the BIST and can (when controlled to do so) cause the outputs of the logic to be tested to be isolated for the purposes of the BIST.

SUMMARY

In one example embodiment described herein there is apparatus comprising: a control domain comprising functional circuitry to perform logical operations when in an operational state, wherein the functional circuitry comprises at least one output and a state of the at least one output is dependent on the logical operations; domain control circuitry to control the control domain to put the functional circuitry in one of the operational state and a non-operational state; isolation circuitry to isolate the functional circuitry within the apparatus by holding the state of the at least one output at a predetermined value when the domain control circuitry puts the functional circuitry in the non-operational state; and self-test control circuitry to cause the domain control circuitry to control the control domain to put the functional circuitry in the non-operational state and to cause a self-test procedure to be carried out with respect to the functional circuitry.

In another example embodiment described herein there is a method of controlling an apparatus comprising: performing logical operations in functional circuitry of a control domain of the apparatus when the functional circuitry in an operational state, wherein the functional circuitry comprises at least one output and a state of the at least one output is dependent on the logical operations; controlling the control domain to put the functional circuitry in one of the operational state and a non-operational state; isolating the functional circuitry within the apparatus by holding the state of the at least one output at a predetermined value when the functional circuitry is in the non-operational state; and causing the domain control circuitry to control the control domain to put the functional circuitry in the non-operational state and to cause a self-test procedure to be carried out with respect to the functional circuitry.

BRIEF DESCRIPTION OF THE DRAWINGS

The present invention will be described further, by way of example only, with reference to embodiments thereof as illustrated in the accompanying drawings, in which.

DESCRIPTION OF EXAMPLE EMBODIMENTS

Figure 1:
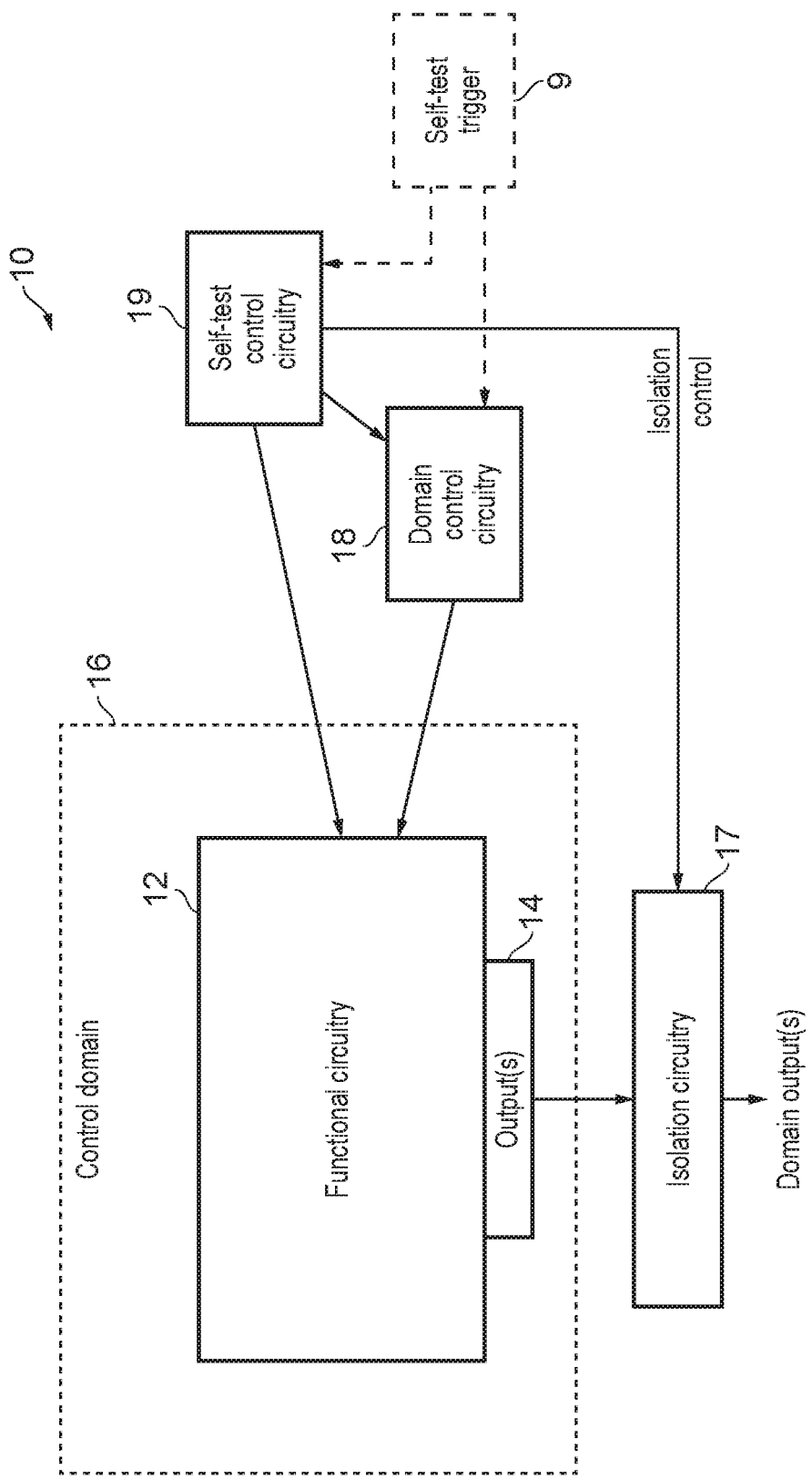
FIG. 1 schematically illustrates an apparatus in one embodiment comprising functional circuitry and associated self-test control circuitry which can cause a self-test procedure to be carried out with respect to the functional circuitry.

Before discussing the embodiments with reference to the accompanying figures, the following description of embodiments is provided.

In accordance with one example configuration there is provided an apparatus comprising: a control domain comprising functional circuitry to perform logical operations when in an operational state, wherein the functional circuitry comprises at least one output and a state of the at least one output is dependent on the logical operations; domain control circuitry to control the control domain to put the functional circuitry in one of the operational state and a non-operational state; isolation circuitry to isolate the functional circuitry within the apparatus by holding the state of the at least one output at a predetermined value when the domain control circuitry puts the functional circuitry in the non-operational state; self-test control circuitry to cause the domain control circuitry to control the control domain to put the functional circuitry in the non-operational state and to cause a self-test procedure to be carried out with respect to the functional circuitry.

Accordingly, the functional circuitry which can be subjected to the self-test procedure under the control of the self-test control circuitry is to be found within a control domain for which domain control circuitry is provided. The domain control circuitry can control the control domain such that the functional circuitry is either in an operational state or a non-operational state. In a data processing apparatus various domains within the apparatus may be defined in order to control the operation of the functional circuitry to be found within those control domains. These control domains may take a variety of forms, but for example may be a power domain arranged to define a power state of the functional circuitry; the control domain may be a reset domain, wherein the domain control circuitry be arranged to control a reset state of the functional circuitry within that reset domain; the control domain may be a clock domain, wherein the domain control circuitry is arranged to control the clock signal provided to functional circuitry within the domain; and so on. Moreover the control domain may be a combination of more than one type of domain mentioned above, e.g. a power and clock domain, or a power, rest, and clock domain.

In this context the inventors have realised that various aspects of the functionality of the control domain, and in particular its control by its associated domain control circuitry, can be reused in the context of arranging for built-in self-test (BIST) functionality being provided. Isolation circuitry which is arranged to isolate the functional circuitry from the remainder of the apparatus in which the functional circuitry is found is provided in order to hold one or more outputs of the functional circuitry at a predetermined value or predetermined values when the functional circuitry is caused to be put into its non-operational state. This allows a self-test procedure to be carried out, under the control of the self-test control circuitry, without the remainder of the apparatus being affected by unexpected values being generated at the at least one output of the functional circuitry. Further, the apparatus is arranged so that the domain control circuitry can be at least partially controlled by the self-test control circuitry, such that when the self-test procedure is to be carried out, the self-test control circuitry can make use of the functionality of the domain control circuitry in order to place the functional circuitry into the non-operational state when the self-test procedure is to be carried out.

In some embodiments the control domain comprises a power domain. Accordingly, in such embodiments the domain control circuitry is then embodied as power domain control circuitry arranged to control the power supplied to the functional circuitry within the power domain.

The power domain control circuitry may take a variety of forms, in dependence on the manner in which it is desired for the power domain to be controlled and in particular the wider context of how control over the power supplied to the functional circuitry should be asserted. For example in some embodiments the domain control circuitry comprises a power control state machine to set a power switch control signal to control the power domain, wherein the power control state machine is responsive to a power state signal to assert a first value of the power switch control signal to cause power to be provided to the functional circuitry when in the operational state and to assert a second value of the power switch control signal to cause power to be withheld from the functional circuitry when in the non-operational state.

The provision of a power control state machine enables a number of clearly defined power states for the power domain to be defined and for the transitions between those states to be defined and reliably controlled. The use of a power switch control signal having a first and second value, which respectively cause power to be provided to the functional circuitry when in its operational state and cause power to be withheld from the functional circuitry when in its non-operational state, represents an example of the well defined and well controlled transitions between power states which a power control state machine can support.

In such embodiments it may be desirable to allow the power control state machine to be provided for the power control of the functional circuitry without modification, and yet to enable the self-test control circuitry to override the control that the power control state machine usually exerts over the power domain in those periods when a self-test procedure is to be carried out. Accordingly, in some embodiments the apparatus further comprises power control override circuitry to assert a power override signal which overrides the power switch control signal in control of the power domain, wherein in the self-test procedure the power control override circuitry asserts the power override signal such that power is provided to the functional circuitry regardless of the value of the power switch control signal asserted by the power control state machine. Thus according to this configuration the power control state machine continues to operate as normal, i.e. unmodified by the provision of the self-test control circuitry, and yet the self-test control circuitry can intervene when the self-test procedure is to be carried out in order to cause power to continue to be provided to the functional circuitry, despite the fact that the power control state machine may be asserting an output value which would otherwise cause power to be withheld from the functional circuitry. This therefore enables those parts of the apparatus which only interact with the power control state machine to continue to do so without modification and yet allow the self-test control circuitry to administer the self-test procedure when required.

However, in some embodiments the power control state machine is arranged to modify the values of the power switch control signal which it asserts when it receives a power override signal from power control override circuitry. In other words in such embodiments the power control override signal intervenes in the operation of the power control state machine when it asserts its power override signal in order to cause the power control state machine to maintain power to the functional circuitry despite the power state signal being received by the power control state machine being such that otherwise (i.e. in the absence of the power override signal) the power control state machine would cause power to be withheld from the functional circuitry. Accordingly, in some embodiments the apparatus further comprises power control override circuitry to assert a power override signal which overrides the power switch control signal in control of the power domain, wherein in the self-test procedure the power control override circuitry asserts the power override signal such that power is provided to the functional circuitry regardless of the value of the power switch control signal asserted by the power control state machine.

Control over the power control state machine may be asserted in a variety of ways in the apparatus, but in some embodiments the apparatus further comprises power policy circuitry to control the power control state machine and to control elements of the functional circuitry, and the power policy circuitry is responsive to a self-test trigger indicating that the self-test procedure should be carried out to control the isolation circuitry to isolate the functional circuitry within the apparatus by holding the state of the at least one output at the predetermined value and to control the elements of the functional circuitry to participate in the self-test procedure. Accordingly in such embodiments, where the operation of the power control state machine is itself under control of power policy circuitry, it can be provided that the power policy circuitry is modified to respond to a self-test trigger indicating that the self-test procedure should be carried out to control not only the power control state machine but also elements of the functional circuitry to participate in the self-test procedure.

The elements of the functional circuitry which the power policy circuitry may control to participate in the self-test procedure may take a variety of forms but in some embodiments the elements of the functional circuitry comprise a clock control for the functional circuitry and at least one reset for the functional circuitry.

As mentioned above power domain control circuitry of the apparatus may be used to control a self-test domain that is defined by a power domain of the apparatus, i.e. the self-test domain and the power domain are coterminous, but further embodiments are also contemplated in which power domain control circuitry may be modified to control a self-test domain, which may or may not be coterminous with a power domain within which the functional circuitry is to be found (where this power domain has its own "unmodified" power domain control circuitry). In such embodiments the domain control circuitry comprises modified power domain control circuitry responsive to the self-test control circuitry to control the control domain to put the functional circuitry in the non-operational state as part of the self-test procedure. The inventors have realised that the configuration of power domain control circuitry may be re-used in order to provide the domain control circuitry needed to enable the self-test control circuitry to cause the self-test procedure to be carried out. Accordingly, existing structures which are typically inserted into the design of a SoC may be adapted in order to support BIST functionality for the SoC. Furthermore, the provision of such structures at this earlier stage in the design process i.e. not at a later stage in EDA, when BIST functionality might otherwise be added as an additional feature of a design, means that this BIST functionality is introduced at an earlier stage in the development cycle of the design of a SoC and enables control over the required isolation necessary for the self-test procedure to be carried out to be more closely integrated into the architecture and micro-architecture of the system.

The self-test control circuitry may also be arranged to control elements of the functional circuitry in a particular manner for the self-test procedure and thus in some embodiments the self-test control circuitry is capable of controlling elements of the functional circuitry to participate in the self-test procedure.

The particular elements of the functional circuitry which may be controlled in this manner may take a variety of forms, but in some embodiments the elements of the functional circuitry comprise a clock control for the functional circuitry and at least one reset for the functional circuitry.

Allowing the self-test control circuitry to control the clock and reset of the functional circuitry in this manner may enable various characteristics of the self-test procedure to be carried out in a way which differs from normal functional operation of the functional circuitry. For example in some embodiments the self-test control circuitry is capable of controlling the clock control for the functional circuitry to apply a self-test clock signal in the self-test procedure which is different to a functional clock signal used when the functional circuitry is in the operational state. There are a variety of ways, for a variety of different tests and purposes, in which a different clock signal may be appropriate for the self-test procedure.

Similarly, in some embodiments the self-test control circuitry is capable of controlling the reset for the functional circuitry to initialise the functional circuitry into a predetermined state for a self-test procedure and after the self-test procedure is complete. Thus, once the self-test procedure is complete, the self-test control circuitry can ensure that the functional circuitry is reset into a predetermined state which is appropriate for it to then continue normal functional operation interacting with the remainder of the apparatus. The self-test control circuitry itself may be variously configured but in some embodiments the self-test control circuitry comprises a finite state machine which controls the self-test procedure. This enables a well-defined set of states to be controlled and for the transitions between them to similarly be well-defined and controlled.

The self-test control circuitry may however be more complex and in some embodiments the self-test control circuitry comprises a processing element arranged to execute software which controls the self-test procedure. This provides a greater degree of flexibility and configurability in the manner in which the self-test procedure is carried out.

The self-test procedure may be carried out at different times as appropriate for the functional circuitry and for the apparatus in which the functional circuitry is found, and in some embodiments the domain control circuitry is responsive to a self-test trigger to control the control domain to put the functional circuitry in the non-operational state and to cause a self-test procedure to be carried out with respect to the functional circuitry.

This self-test trigger may take a variety of forms, but in embodiments the self-test trigger comprises at least one of:

an indication that the apparatus is powering on or off; an indication that the apparatus is booting up; an indication that a self-test timer has elapsed; and an indication that a predetermined event has occurred.

As mentioned above the control domain may take a variety of forms and in some embodiments the control domain may comprise a reset domain. In other embodiments the control domain may comprise a clock domain.

In accordance with one example configuration there is provided a method of controlling an apparatus comprising: performing logical operations in functional circuitry of a control domain of the apparatus when the functional circuitry in an operational state, wherein the functional circuitry comprises at least one output and a state of the at least one output is dependent on the logical operations; controlling the control domain to put the functional circuitry in one of the operational state and a non-operational state; isolating the functional circuitry within the apparatus by holding the state of the at least one output at a predetermined value when the functional circuitry is in the non-operational state; and causing the domain control circuitry to control the control domain to put the functional circuitry in the non-operational state and to cause a self-test procedure to be carried out with respect to the functional circuitry.

The method may be carried out at a variety of appropriate opportunities in the life cycle of the apparatus, but in some embodiments the method is carried out during runtime of the apparatus.

In some embodiments the method is carried out at manufacture of the apparatus.

Particular embodiments will now be described with reference to the figures.

FIG. 1 schematically illustrates components of an apparatus in one example embodiment. The functional circuitry 12 performs logical operations (data processing operations) when in an operational state and has one or more outputs 14 which connect to other components of the apparatus 10. The logical values or states of the outputs 14 of the functional circuitry 12 depend on the particular operations being carried out. The functional circuitry 12 lies within a control domain 16 and at the periphery of the control domain 16 isolation circuitry 17 is provided. The isolation circuitry may also be referred to as a "guard cell". The particular configuration of the isolation circuitry is not of significance. Its function is to either pass the output(s) 14 unhindered or to hold the output(s) (as perceived by the remainder of the apparatus) at predetermined value(s), the control over which of these manners of operating is used being dependent on an isolation control signal which the isolation circuitry receives. Thus, the output(s) 14 of the functional circuitry 12 are received by the isolation circuitry 17 and the isolation circuitry 17 has domain outputs corresponding to the outputs 14 of the functional circuitry. The isolation circuitry 17 serves to either pass the output(s) unaffected as the domain outputs, or when controlled to do so serves to isolate the functional circuitry 12 from the remainder of the apparatus 10 by holding the domain outputs at fixed values (states) regardless of the state of the outputs 14. The apparatus 10 is shown to further comprise domain control circuitry 18 which exerts control over the control domain, and hence over the components which are to be found within the control domain 16. The nature of the control domain 16 may vary. For example, the control domain 16 may correspond to a power domain and the domain control circuitry 18 then corresponds to power domain control circuitry. In such an embodiment the power domain control circuitry then determines a power state of the power domain and in consequence a power state of the functional circuitry 12. In another example the control domain 16 may correspond to a clock domain and the domain control circuitry 16 then corresponds to a clock control, which provides a clock signal distributed to components within the clock domain. In another example the control domain 16 may correspond to a reset domain and the domain control circuitry 18 then corresponds to a reset control, which is arranged to determine a reset state for components within the reset domain. Furthermore, the control domain 16 may correspond to a combined power, clock, and reset domain and the domain control circuitry 18 then corresponds to a power, clock, and reset control, which is arranged to determine a power state for components within the control domain, to provide a clock signal for components within the control domain, and to to determine a reset state for components within the reset domain.

The apparatus 10 is shown to further comprise self-test control circuitry 19. This self-test control circuitry 19 is provided such that in addition to being able to perform its usual logical (data processing) operations, the functional circuitry 12 can be subjected to testing. Such a test may not only be carried out during the manufacture of the apparatus 10, but also on an ongoing basis during operation of the apparatus as required. Such in-system, built-in self-test (BIST) provides the capability for permanent fault identification in the apparatus where they can arise during the lifetime of the apparatus, caused by defects that develop over time. In order to allow the BIST to be carried out, the self-test control circuitry 19 interacts with the functional circuitry 12, with the domain control circuitry 18, and with the isolation circuitry 17. As mentioned above, the isolation circuitry 17 serves to isolate the output(s) 14 of the functional circuitry 12 from the remainder of the apparatus 10. Hence when the functional circuitry 12 participates in a BIST procedure, the consequent changes in state of its output(s) 14 are isolated from the remainder of the apparatus, since the isolation circuitry 17 holds the domain output(s) at fixed (predetermined) values. The isolation circuitry does this under the control of the self-test control circuitry 19. In particular it should be noted that the approach of the present techniques is that the self-test control circuitry 19 also exerts a degree of control over the domain control circuitry 18. Where, under normal operational conditions, the domain control circuitry 18 can control those parts of the apparatus which lie within the control domain 16 (i.e. in the example of FIG. 1 the functional circuitry 12) to either be in an operational state or a non-operational state, the self-test control circuitry 19 takes advantage of this capability when the BIST is to be carried out. The particular nature of the control that the self-test control circuitry 19 exerts over the domain control circuitry 18 can take a variety of forms in dependence on the nature of the control domain 16 and the nature of the domain control circuitry 18, and various different example embodiments are described with respect to the figures that follow. However, generally where the domain control circuitry is capable of causing the functional circuitry 12 to either be in its (normal) operational state or alternatively being a non-operational state, the self-test control circuitry 19 takes advantage of the non-operational state of the functional circuitry 12 in order to carry out the BIST. Note also that, as illustrated in FIG. 1, the self-test circuitry 19 interacts with the functional circuitry 12, exerting some control over the functional circuitry 12 when the BIST is to be carried out. The BIST procedure itself may take a variety of forms, but may for example involve the logic of the functional circuitry 12 being tested using randomised test patterns generated with the purpose of seeking to establish if any faults have developed with the functional circuitry, even if these are only in rarely accessed corner cases. Regardless of the nature of the testing of the functional circuitry 12 in the BIST, the isolation provided by the isolation circuitry 17 ensures that the components of the apparatus other than the functional circuitry 12 within the control domain 16 can continue to functionally operate whilst this BIST of the functional circuitry 12 goes on without being affected by non-functional outputs.

FIG. 1 also shows that (optionally—dashed lines) a self-test trigger 9 may cause the self-test procedure to be carried out. Generally this may be at any time in the existence of the apparatus 10, for example during or at the conclusion of its manufacture, or else during the operational lifetime of the apparatus 10. Further the self-test trigger 9 may be received by the self-test circuitry 19 and/or the domain control circuitry 18 as required. The self-test trigger itself could take various forms. For example it may be an indication that the apparatus is booting up, an indication that a self-test timer has elapsed, an indication that a predetermined event has occurred, and so on. The nature of the self-test trigger is not of significance and may be freely defined.

Figure 2:
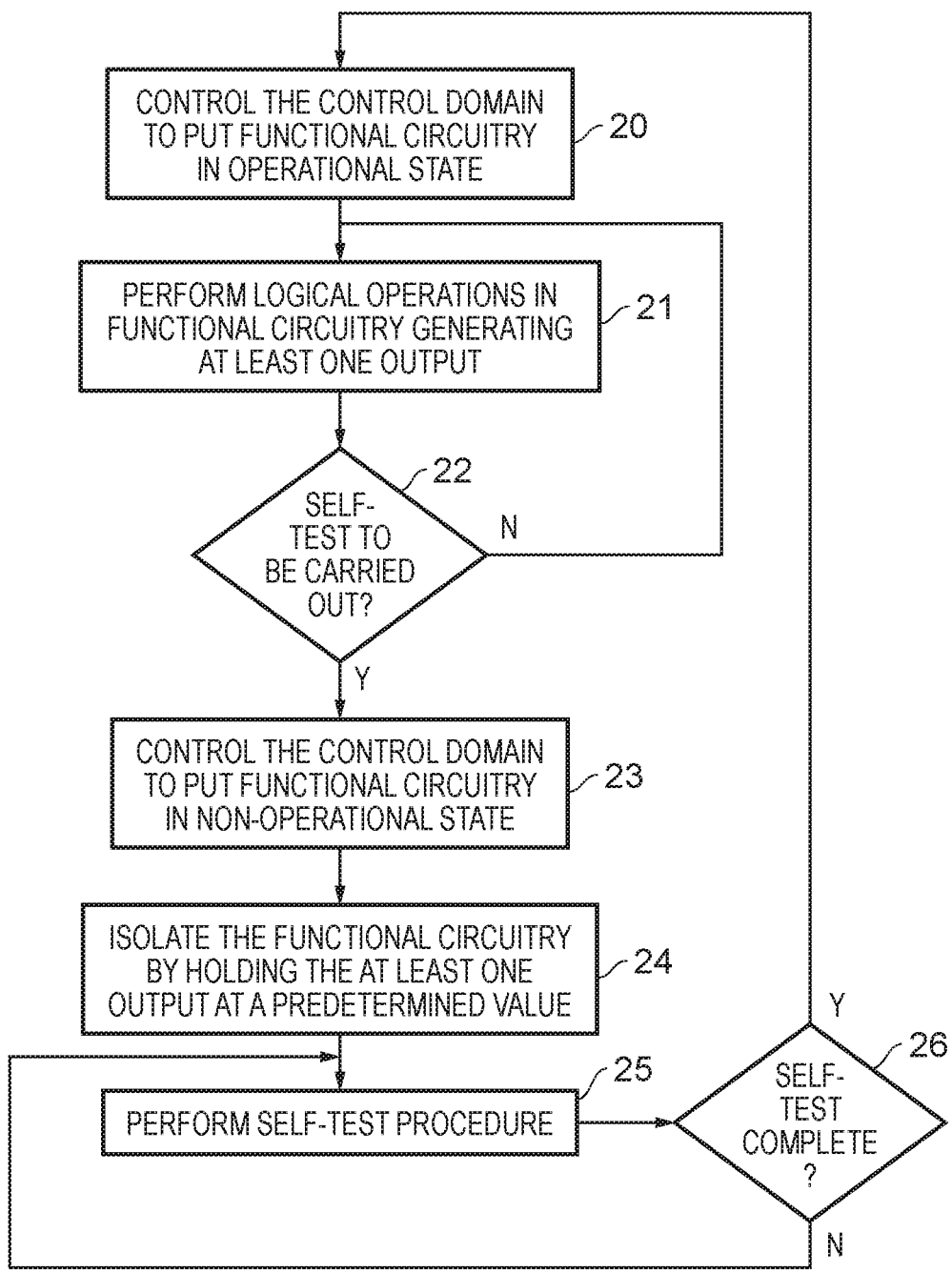
FIG. 2 shows a sequence of steps which are taken in one embodiment when a self-test procedure is caused to be carried out with respect to functional circuitry in an apparatus.

FIG. 2 is a flow diagram showing a sequence steps which are carried out according to one embodiment, for example when controlling the apparatus 10 of FIG. 1. The flow can be considered to begin at step 20 where a control domain is controlled (by domain control circuitry) to put functional circuitry in its operational state. Then, at step 21, the functional circuitry performs logical operations (data processing) resulting in at least one output of the functional circuitry being indicative of the result of those logical operations. At step 22 it is determined if self-test is to be carried out and whilst it is not the flow returns to step 21 for the functional circuitry to continue performing its logical operations. However at step 22, when it is determined that self-test is to be carried out, the flow proceeds to step 23 where the control domain is controlled to put the functional circuitry in a non-operational state. Accordingly, in this state the functional circuitry is no longer performing its usual logical operations. Further, at step 24 control over the isolation circuitry is exerted to isolate the functional circuitry from the remainder of the apparatus by holding the at least one domain output at a predetermined value. Thus configured, at step 25 a self-test procedure is performed. It is determined at step 26 if the self-test procedure is complete and whilst it is not the flow returns to step 25. Once the self-test procedure is complete the flow returns to step 20 for the control domain to be controlled to return the functional circuitry to its operational state (and to deactivate the isolation circuitry).

Figure 3:
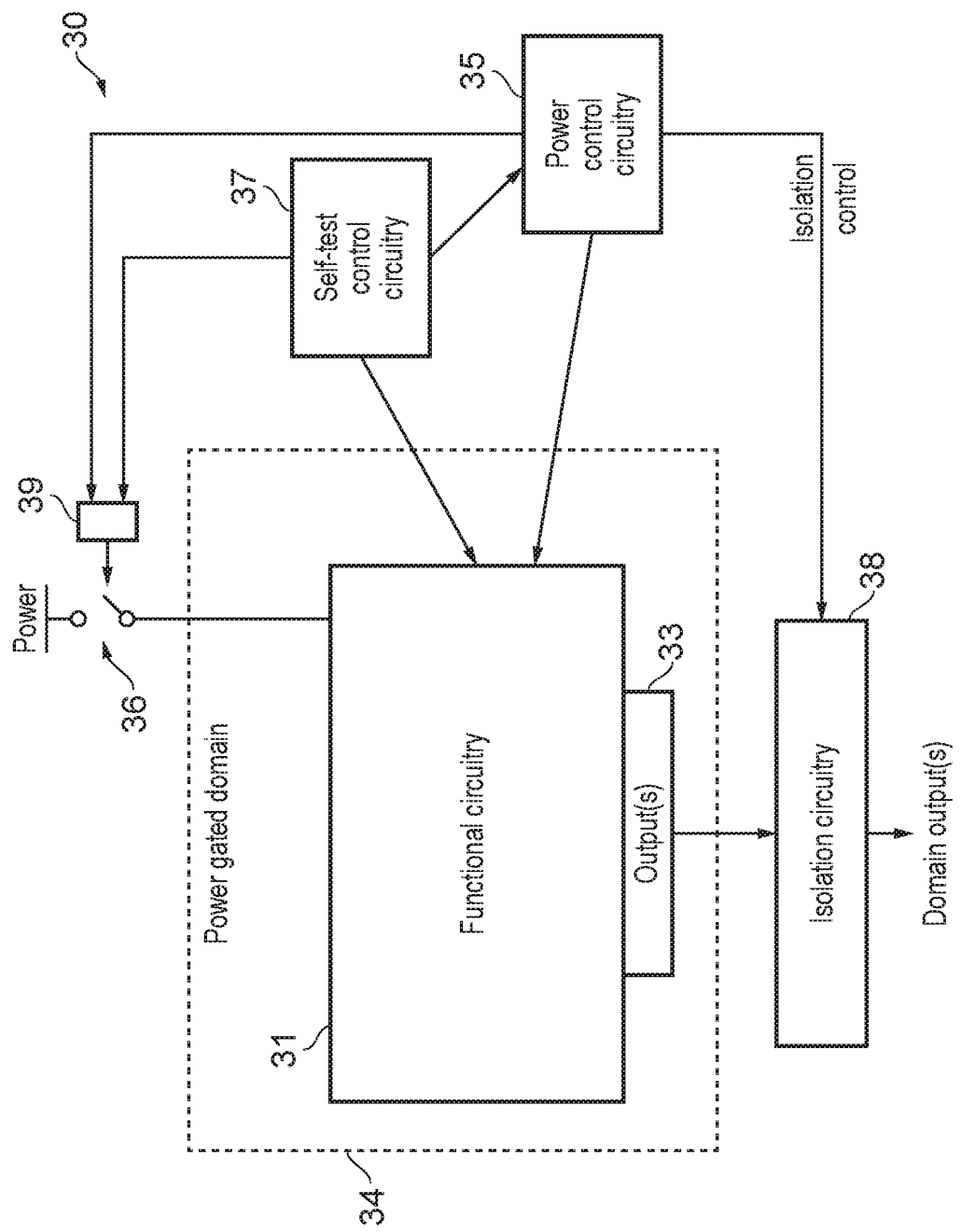
FIG. 3 schematically illustrates functional circuitry in one embodiment which is contained with a power-gated domain under the control of power control circuitry with which self-test control circuitry interacts in order to cause a self-test procedure to be carried out with respect to the functional circuitry.

FIG. 3 schematically illustrates an apparatus 30 in one example embodiment, in which functional circuitry 31 with output(s) 33 lies within a power gated domain 34. The power gated domain 34 is under the control of the power control circuitry 35. The power control circuitry 35 controls a power switch 36 which provides power to components within the power gated domain 34. Accordingly, the power control circuitry 35 can determine whether the functional circuitry 31 is in an operational (i.e. fully powered) state in which normal data processing operations are carried out or is in a different (non-operational) state. With respect to the power control over the power gated domain 34, such a non-operational state may for example be a fully off state or may also be a low-power state, in which the power consumption of the components in the power gated domain 34 is considerably lower than when in its operational state, but some power to the functional circuitry 31 remains, for example for the purposes of data retention. The apparatus 30 comprises self-test control circuitry 37 which makes use of aspects of the functionality of the power control circuitry 34 to enable it to cause a self-test procedure to be carried out with respect to the functional circuitry 31. Thus the self-test control circuitry 37 exerts control not only over the functional circuitry 31, but also over the power control circuitry 35. Note that in the example of FIG. 3 the isolation control of the isolation circuitry 38 is generated by power control circuitry 35. This is also ultimately under the control of the self-test control circuitry 37. The apparatus 30 also comprises a selection gate 39, the output of which controls the power switch 36. In normal operation the output of the power control circuitry 35 controls the power switch 36 essentially directly, i.e. as though the gate 39 were not present. However the selection gate 39 provides the self-test control circuitry 37 with the ability to override the output of the power control circuitry 35. In other words, in the example of FIG. 3, regardless of the signals sent from the power control circuitry 35 seeking to control the power switch 36, if a control signal for the power switch is received by gate 39 from the self-test control circuitry 37 this takes precedence and overrides the power control signal from the power control circuitry 35. In this manner the self-test control circuitry 37 has overall control over the power gated domain 34 when self-test should be carried out.

Figure 4:
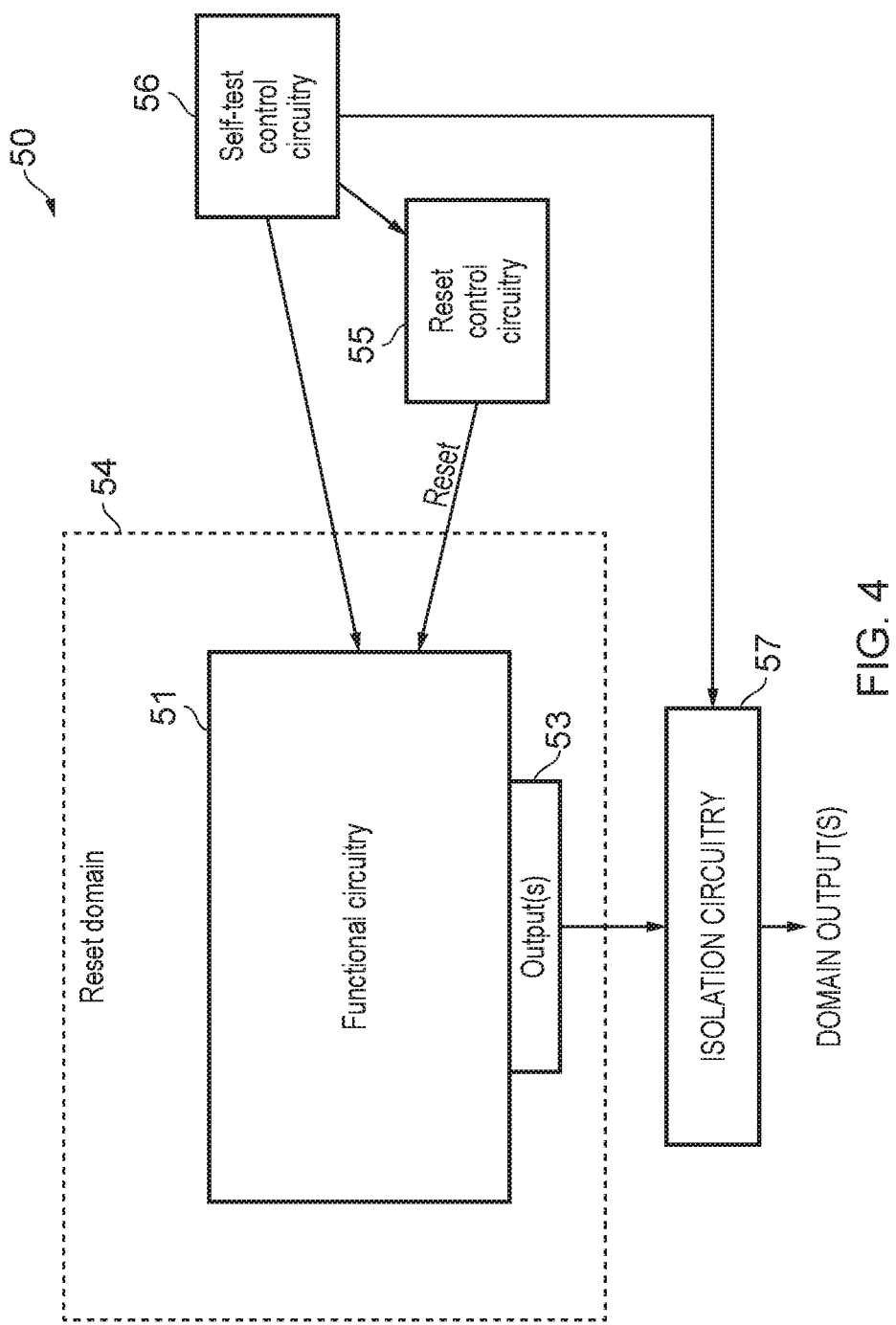
FIG. 4 schematically illustrates functional circuitry which lies within a reset domain in an apparatus in one embodiment, in which reset control circuitry controls the resetting of the functional circuitry and self-test control circuitry interacts with the reset control circuitry when causing a self-test procedure to be carried out with respect to the functional circuitry.

FIG. 4 schematically illustrates an apparatus 50 comprising functional circuitry 51 and output(s) 53 which reside within a reset domain 54. Reset control circuitry 55 controls the reset state of components within the reset domain 54. Self-test control circuitry 56 makes use of the functionality of the reset control circuitry 55 to support the self-test capability which the self-test control circuitry 56 provides and isolation circuitry 57 is also provided. In normal operation the reset control circuitry 55 allows components within the reset domain 54 to perform logical processing operations in an operational state. Additionally, the reset control circuitry 55 can exert a reset control signal in order to cause one or more states of the functional circuitry 51 to be reset to predetermined values. This may for example be done on a reboot or when seeking to return the functional circuitry 51 to a known state. The self-test control circuitry 56 is arranged to cause reset control circuitry 55 to put the functional circuitry 51 in to a non-operational state when a self-test procedure is to be carried out. Self-test control circuitry 56 may also exert control over elements of the functional control circuitry 54 when the self-test procedure is carried out.

Figure 5:
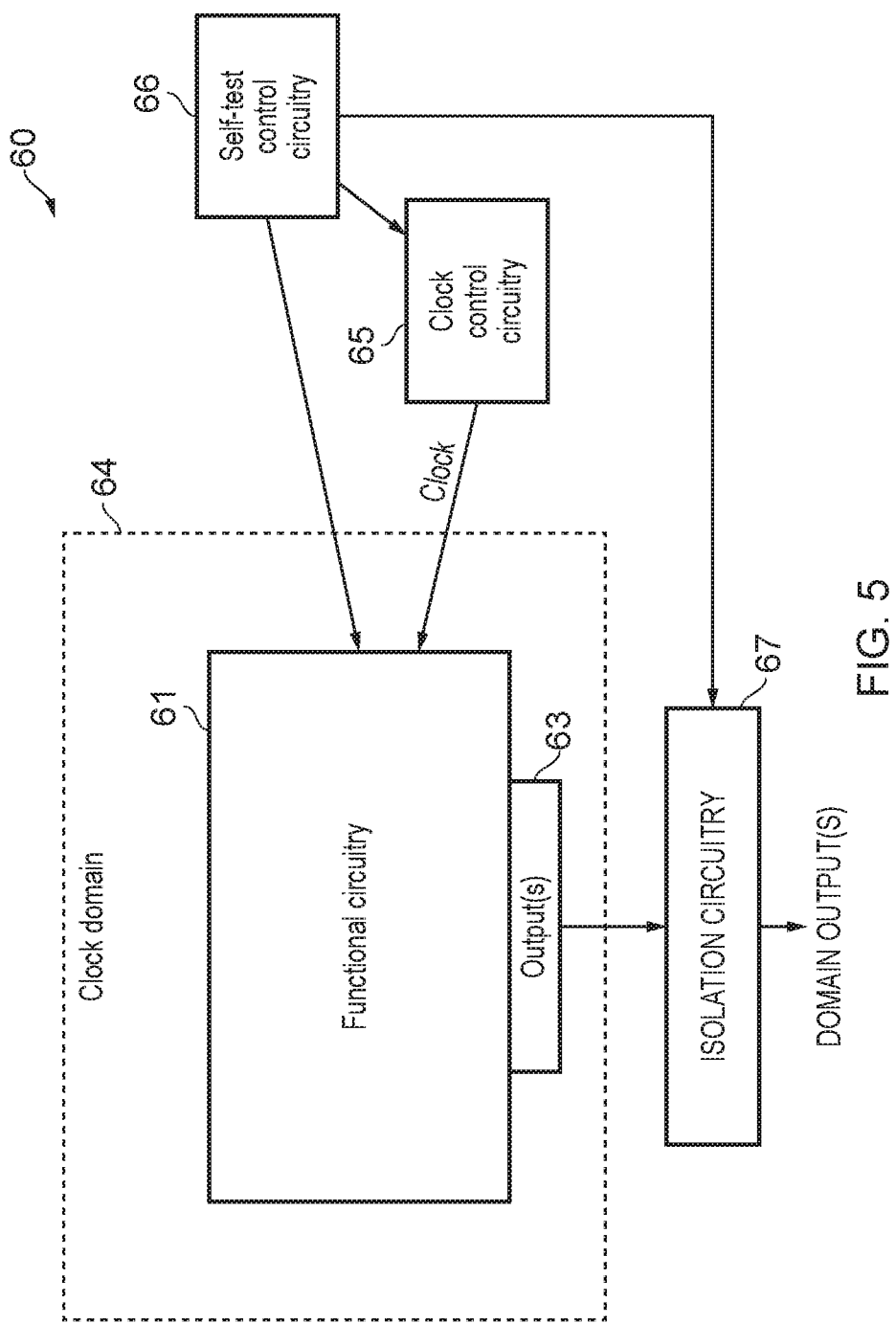
FIG. 5 schematically illustrates an apparatus in one embodiment in which functional circuitry lies within a clock domain, wherein clock control circuitry controls the clock signal provided to the functional circuitry and self-test control circuitry interacts with the clock control circuitry when causing self-test procedure to be carried out with respect to the functional circuitry.

FIG. 5 schematically illustrates an apparatus 60 comprising functional circuitry 61 and output(s) 63 which reside within a clock domain 64. Clock control circuitry 65 controls the clocking of components within the clock domain 64 by the generation of a clock signal which is distributed to components within the clock domain 64. Self-test control circuitry 66 makes use of the functionality of the clock control circuitry 65 to support the self-test capability which the self-test control circuitry 66 provides and isolation circuitry 67 is also provided. In normal operation the clock control circuitry 65 generates a clock signal appropriate for the components within the clock domain 64 to perform logical processing operations in an operational state. The clock control circuitry 65 can also generate other clock signals. The self-test control circuitry 66 is arranged to cause the clock control circuitry 65 to put the functional circuitry 61 in to a non-operational state when a self-test procedure is to be carried out. This may for example comprises generation of a clock signal which differs from the clock signal used in the operational state of the functional circuitry. Self-test control circuitry 66 may also exert control over elements of the functional control circuitry 64 when the self-test procedure is carried out.

Figure 6:
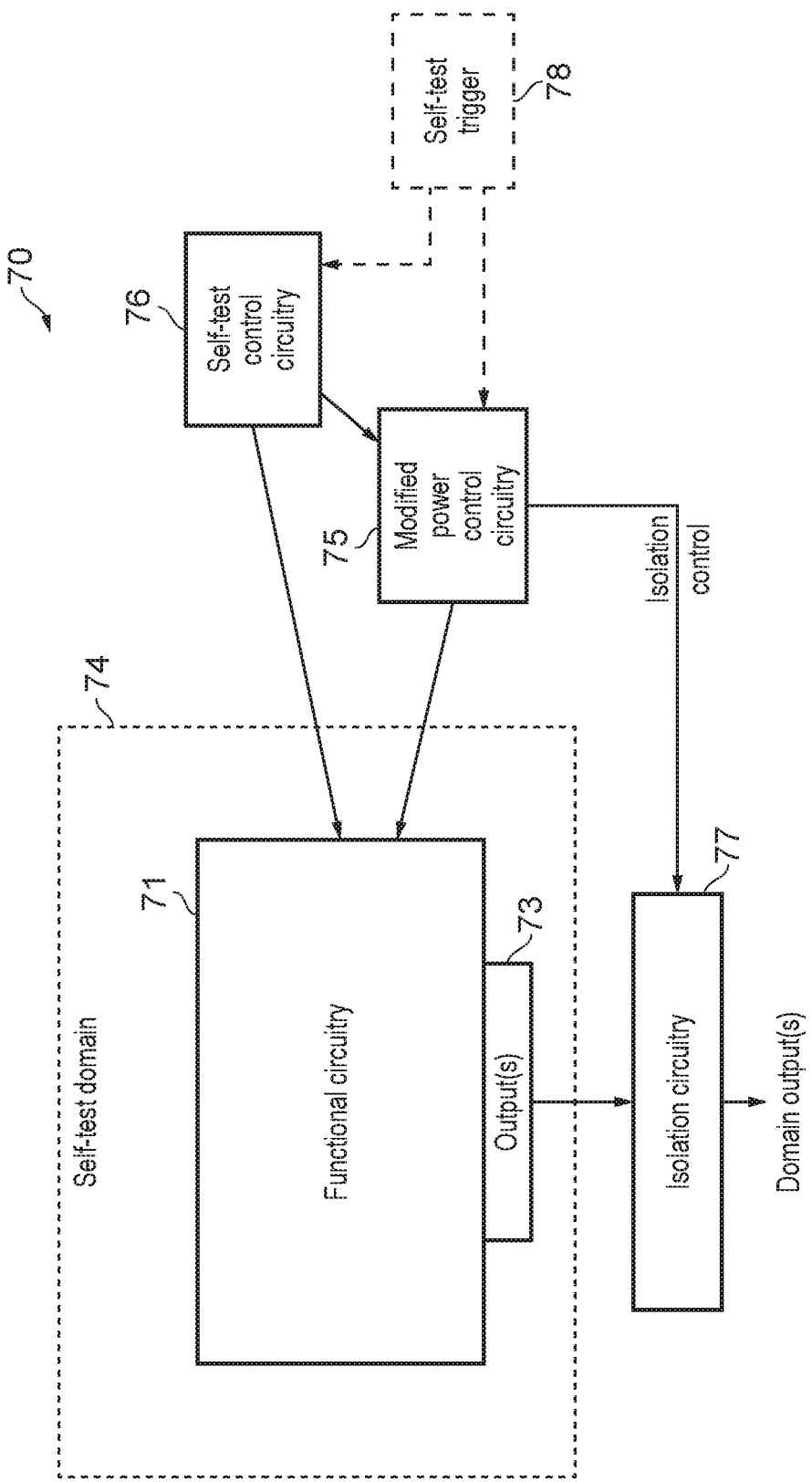
FIG. 6 schematically illustrates an apparatus in one embodiment in which the functional circuitry lies within a self-test domain and modified power control circuitry is provided with which the self-test control circuitry interacts to isolate the functional circuitry from the remainder of the apparatus when a self-test procedure is carried out with respect to the functional circuitry.

FIG. 6 schematically illustrates apparatus 70 in one example embodiment. Here the apparatus 70 is shown to comprise functional circuitry 71 and its output(s) 73, which all lie within a "self-test" domain 74. Note in particular that associated with this self-test domain 74 is modified power control circuitry 75. This modified power control circuitry 75 is arranged to exert control over components found within the self-test domain 74 in a manner similar to that described above with reference to the control domain 16 of FIG. 1, the power gated domain 34 of FIG. 3, the reset domain 54 of FIG. 4, and the clock domain 64 of FIG. 5. However a particularly pertinent comparison may be made with reference to the power gated domain 34 and the power control circuitry 35 of the example apparatus shown in FIG. 3. The present techniques recognise that for the purposes of providing self-test capability use may be made of existing structures, with some modification, in order to provide self-test capability. FIG. 6 illustrates such an example. An apparatus such as apparatus 70 in FIG. 6, according to contemporary design processes, is typically constructed by the use of EDA tools to place blocks of logic which are coupled to one another in order to build up a complete data processing apparatus (i.e. here, a SoC). In that context the present techniques recognise that some of these existing structures, such as those provided in order to control the state of a power domain, may be repurposed in this context in order to allow self-test capability to be provided. Accordingly, the "modified" power control circuitry 75 could, in a different context, be considered to be "power control circuitry" arranged to provide control over the state of an associated power domain, but in the context illustrated in FIG. 6, where it has been used in association with a "self-test domain" 74, together with the placement of the associated self-test control circuitry 76 and the isolation circuitry 77, this power control circuitry has been modified to enable the self-test control circuitry to carry out a self-test procedure with respect to the functional circuitry 71, thereby reusing the structure which would otherwise be used for the control of a power domain. The extent to which the power control circuitry is thus "modified" may vary, ranging from the circuitry merely being repurposed, through to some structural amendment of the circuitry being implemented, as will be discussed in more detail with reference to the examples shown in the figures which follow.

FIG. 6 also shows that (optionally—dashed lines) a self-test trigger 78 may cause the self-test procedure to be carried out. Generally this may be at any time in the existence of the apparatus 70, for example during or at the conclusion of its manufacture, or else during the operational lifetime of the apparatus 70. Further the self-test trigger 78 may be received by the self-test circuitry 76 and/or the modified power domain control circuitry 75 as required. The self-test trigger itself could take various forms. For example it may be an indication that the apparatus is booting up, an indication that a self-test timer has elapsed, an indication that a predetermined event has occurred, and so on. The nature of the self-test trigger is not of significance and may be freely defined. Note that use of a self-test trigger may also be applied to any of the examples described herein, and illustration of this feature is omitted in some figures merely for brevity and clarity.

Figure 7:
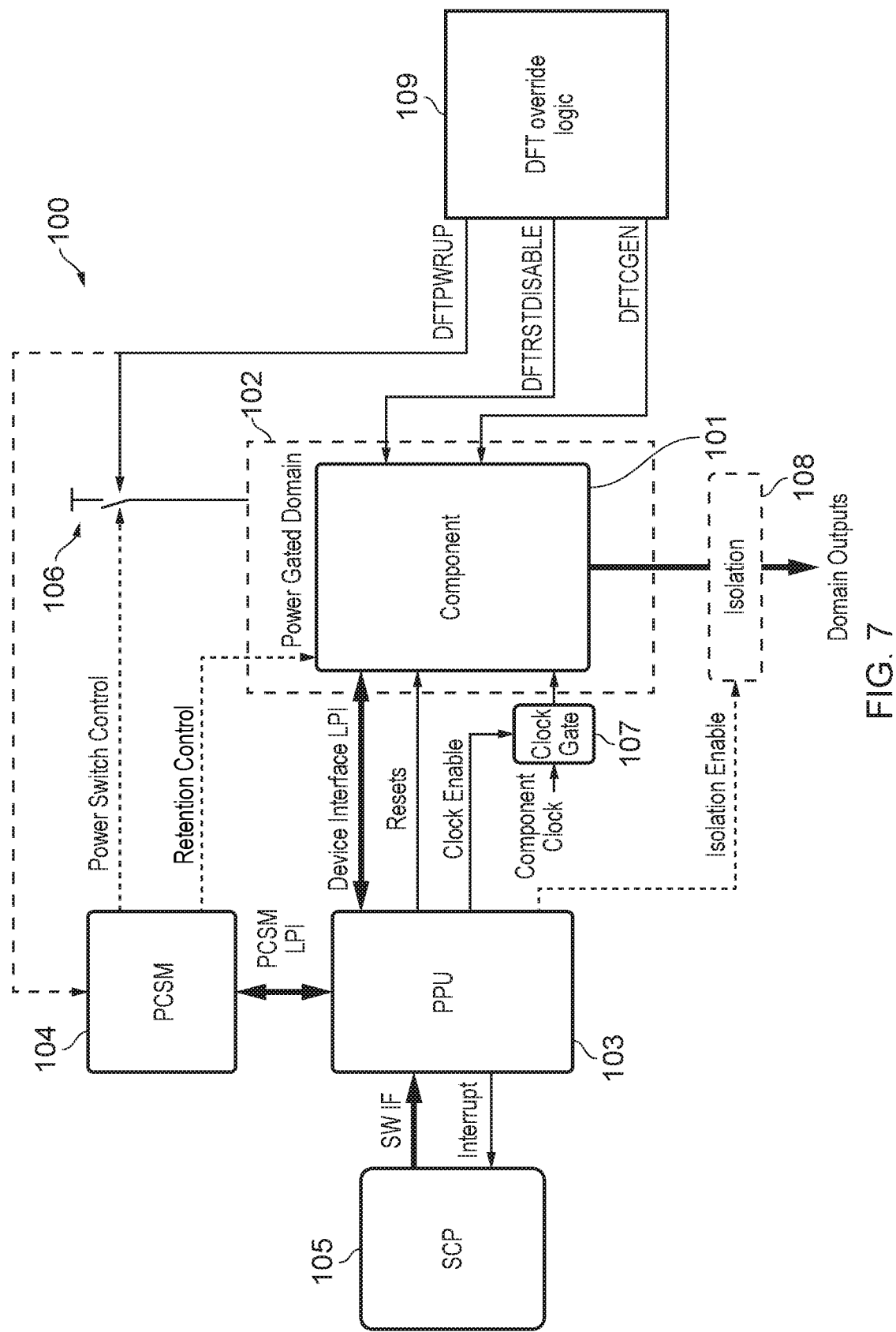
FIG. 7 schematically illustrates an apparatus in one embodiment in which a component within a power-gated domain may be the subject of a self-test procedure under the control of self-test control circuitry, which interacts with a power control state machine and a power policy unit of the apparatus when the self-test procedure is carried out.

FIG. 7 schematically illustrates an apparatus 100 in one example embodiment. A component 101 is shown, residing within a power gated domain 102. The power control, in particular by means of the power gated domain 102, is exerted over the component 101 by means of power domain control circuitry, embodied here by the power policy unit (PPU) 103 and the power control state machine (PCSM) 104. The PPU 103 and the PCSM 104 are, in this example, components provided as part of the Arm® CoreLink PCK-600 Power Control Kit, provided by Arm® Limited of Cambridge, UK. The PPU 103 takes a software-programmed power domain policy and on the basis thereof controls low-level hardware control signals. The PCSM 104 is a state machine for the sequencing of power switch chains and retention controls. The PCSM executes power mode changes under the PPU's direction. FIG. 7 also shows a power switch 106 and a clock gate 107, which are controlled, respectively, by the PCSM 104 and the PPU 103 in order either to operate the component 101 in an operational state in which it performs logical (data processing) operations, or to switch the component 101 in to a non-operational state (e.g. a data retention state or a fully off state). FIG. 7 further shows the provision of a system control processor 105 (also referred to herein as a 'safety island') and a block of circuitry labelled DFT override logic 109, where DFT refers to "design for test". In the example embodiment shown, the SCP 105 is provided by a relatively lightweight processor core such as a Cortex-M processor (as provided by Arm® Limited). The SCP 105 is provided here in order to control and oversee the carrying out of a self-test procedure with respect to the component 101. When the self-test procedure is to be carried out with respect to the component 101, the SCP 105 first interacts via a software interface (SW IF) with the PPU 103, requesting entry to a defined "OFF" state for the component 101. In response to this the PPU 103 interacts with the component 101 via the device interface LPI ("low power interface") in order for the component to enter its OFF state in an orderly fashion. The PPU 103 also controls an "Isolation Enable" signal for the isolation circuitry 108 in order to cause isolation of the component 101 from the remainder of the apparatus 100 whilst the self-test procedure is carried out. The PPU 103 handshakes with the PCSM 104 (via the PCSM low power interface (LPI)) in order for power to be removed from the component 101. The PCSM 104 causes power to be removed from the component 101 by exerting a corresponding state of the power switch control, causing power gate 106 to switch off. At this stage the PPU reports back to the software executing in the SCP 105 (by means of an interrupt) to indicate that the component 101 has entered its OFF mode. The SCP 105 and DFT override logic 109 then operate in conjunction with one another to allow the self-test procedure to be carried out. One particular feature of this to be noted is that the DFT override logic 109 is also connected to the power gate 106 and by means of the signal DFTPWRUP overrides the power switch control exerted by the PCSM 104. The component 101 thus remains powered for the purposes of carrying out the self-test procedure. In addition the DFT override logic 109 also can exert bespoke clock and reset signals for the component 101 for the purposes of the self-test procedure (DFTCGEN and DFTRSTDISABLE). These override signals also enable any reset signals issued by the PPU 103 and the clock signal generated from the Component Clock/Clock Enable combination acting on the Clock Gate 107 to be overridden. Thus, under control of the SCP 105 and by the provision of the DFT override logic 109 use is made of the power domain control circuitry (i.e. the PPU 103 and the PCSM 104) in order to enable the self-test procedure to be carried out, but in this example without requiring any modification to the PPU 103 or the PCSM 104. Otherwise expressed, the PPU 103 and the PCSM 104 have no knowledge of the self-test capability of the apparatus 100. As described above, for the purposes of carrying out this self-test procedure the PPU 103 and PCSM 104 act in the same manner as they would when the component 101 is genuinely put into its OFF state. Finally, FIG. 7 also shows an alternative configuration (dashed line) in which the DFTPWRUP signal from the DFT override logic 109 instead explicitly causes the power switch control exerted by the PCSM 104 to be changed. In this configuration the DFTPWRUP signal from the DFT override logic 109 is received by the PCSM 104. The PCSM 104 is configured so that, when DFTPWRUP signal is asserted, it keeps the power switch control in a state to control the power gate 106 to keep power provided to the component 101, despite otherwise being in a state corresponding to the defined "OFF" state for the component 101.

Figure 8:
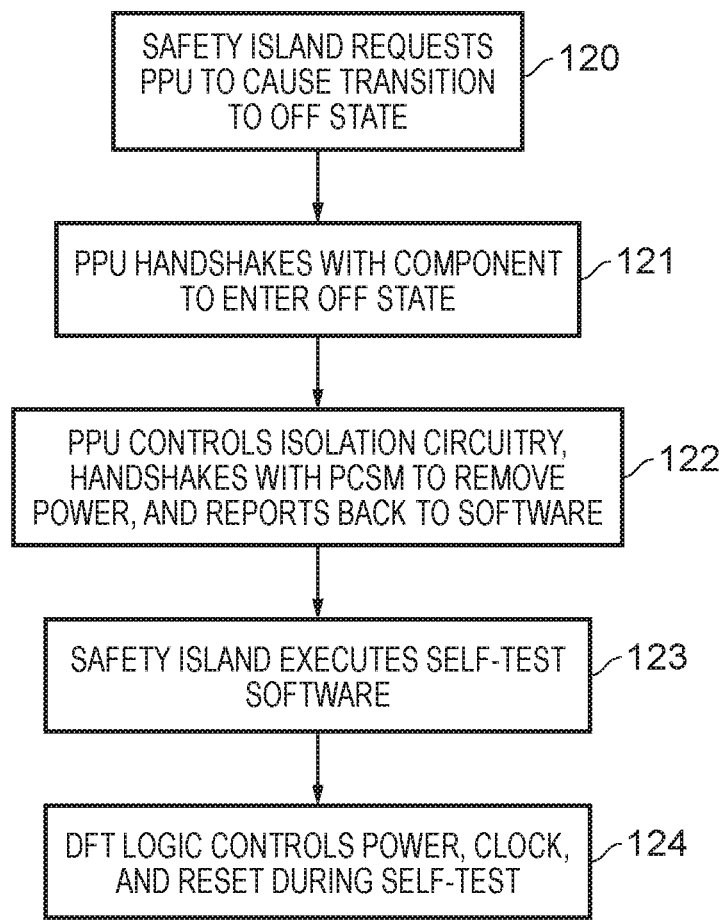
FIG. 8 is a flow diagram illustrating a sequence of steps which are taken according to the method of one embodiment when a self-test procedure is carried out with respect to functional circuitry such as the component of FIG. 7.

FIG. 8 is a flow diagram showing a sequence of steps which are taken in one embodiment, for example in the context of an apparatus such as the apparatus 100 shown in FIG. 7, when a self-test procedure is carried out. The flow begins at step 120 where software (in this example running in the "safety island") requests the PPU to transition the component into its OFF state. Then at step 121 the PPU handshakes with the component to enter its OFF state. At step 122 the PPU controls the isolation circuitry to cause the component to be isolated from the remainder of the apparatus and the PPU handshakes with the PCSM in order to (seek to) remove power from the component. When this is done the PPU reports back to software (e.g. via an interrupt). In response to this, at step 123, the "safety island" (i.e. in this context the processor) executes self-test software in order to cause a self-test procedure to be applied to the component under test. In support of this, at step 124 the DFT logic intervenes to take control of power, clock, and reset for the component during the self-test. Once the self-test procedure is complete, the safety island can request, via the PPU, that the component is returned to, for example, an operational state in which it is fully powered.

Figure 9:
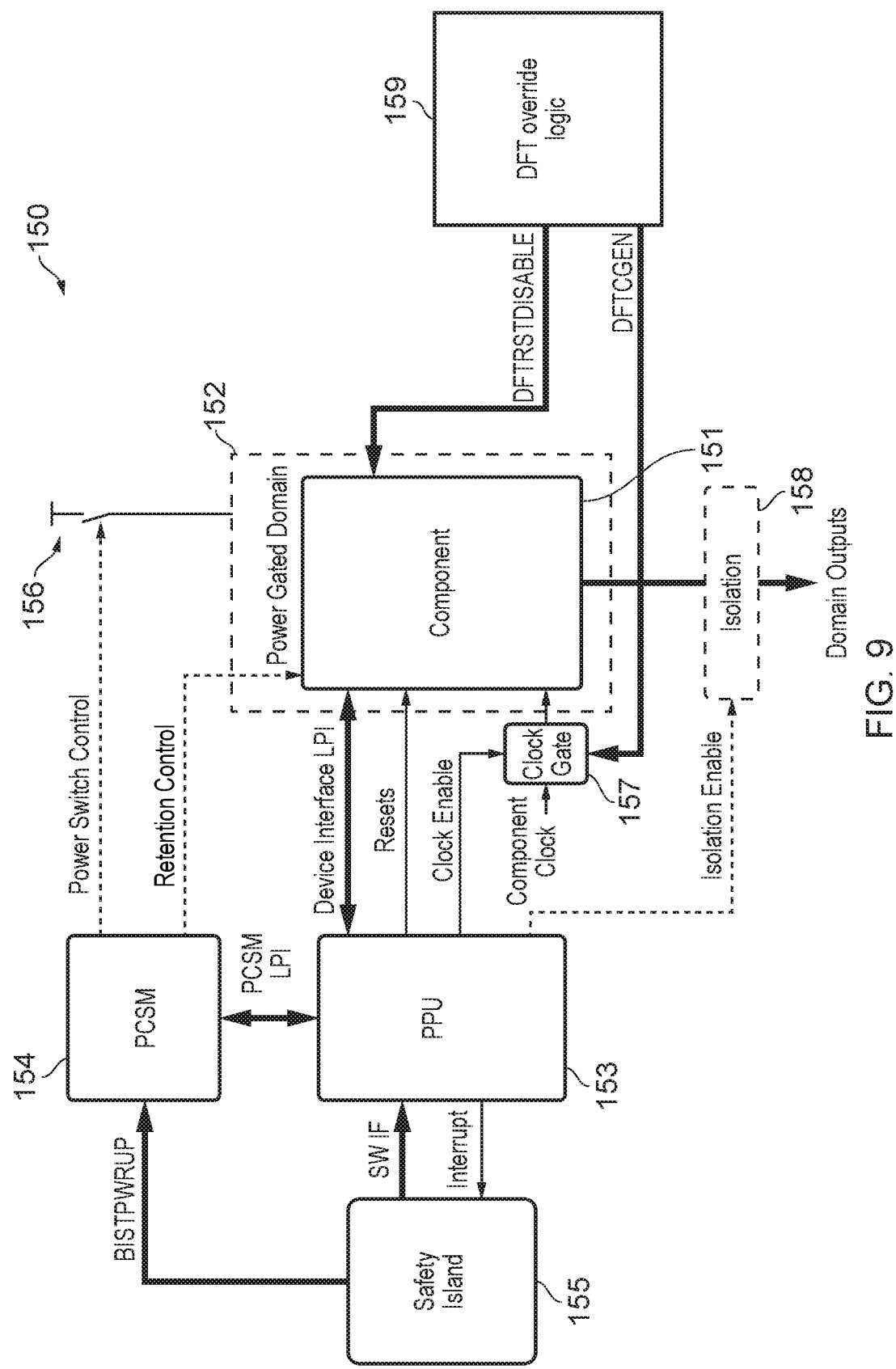
FIG. 9 schematically illustrates an apparatus in one embodiment in which a component within a power-gated domain may be the subject of a self-test procedure under the control of self-test control circuitry, which interacts with a power control state machine and a power policy unit of the apparatus when the self-test procedure is carried out.

FIG. 9 schematically illustrates apparatus 150 in one example embodiment. It should be recognised that much of the structure in this example is the same as described above with reference to FIG. 7. A component 151 resides within a power gated domain 152, the power state of which is controlled by a PPU 152 and a PCSM 154. A "safety island" processor/software 155 controls a procedure by which a self-test process can be carried out with respect to the component 151. DFT override logic 159 is provided in order to support the safety island 155 in doing this. One distinction in the example of FIG. 9 with respect to that of FIG. 7 is that here an additional "TEST" state is defined for the component 151 with respect to the power control circuitry, i.e. the PPU 153 and the PCSM 154. The safety island 155 makes use of this "TEST" state when the self-test procedure is to be carried out. Further, in support of this, an additional signal (BISTPWRUP) is provided which is issued by the safety island 155 and received by the PCSM 154. When the self-test procedure is to be carried out the safety island 155 interacts with the PPU 153 via the software interface (SW IF) requesting entry into the "TEST" state for the component 151. The safety island 155 also sets the BISTPWRUP override signal that will cause the PCSM to ignore a power down request. Hence the PPU 153 responds to a request to enter the "TEST" state for the component 151 in the same manner as it would to cause the component 151 to enter its "OFF" state. The PPU handshakes with the component 152 to enter its OFF mode and drives the Isolation Enable signal in order to cause the isolation circuitry 158 to isolate the component 151 from the remainder of the apparatus 150. The PPU 153 handshakes with the PCSM (via the PCSM LPI) (intending) to remove power from the component 151 and reports back (via an interrupt) to the software executing in the safety island 155. Accordingly it should be recognised that the PPU acts as though it is switching the component 151 into its OFF mode, however the exertion of the BISTPWRUP signal from the safety island 155 to the PCSM 154 overrides the power down request from the PPU and causes the PCSM to keep the power switch control such that the power gate 156 is kept on, continuing to power the power gate domain 152 and hence the component 151, whilst the self-test procedure is carried out. The safety island 155 in conjunction with the DFT override logic 159 then causes the self-test procedure to be carried out. The safety island executes self-test software for this purpose. The DFT override logic 159 controls the clocking of the component 151 by means of the DFTCGEN signal and the reset of the component is disabled by means of the DFTRSTDISABLE during this self-test procedure. Once the self-test procedure has been completed, the safety island 155 can, by interaction with the PPU 153, cause the component 151 to be returned for example, to an operational ON state.

Figure 10:
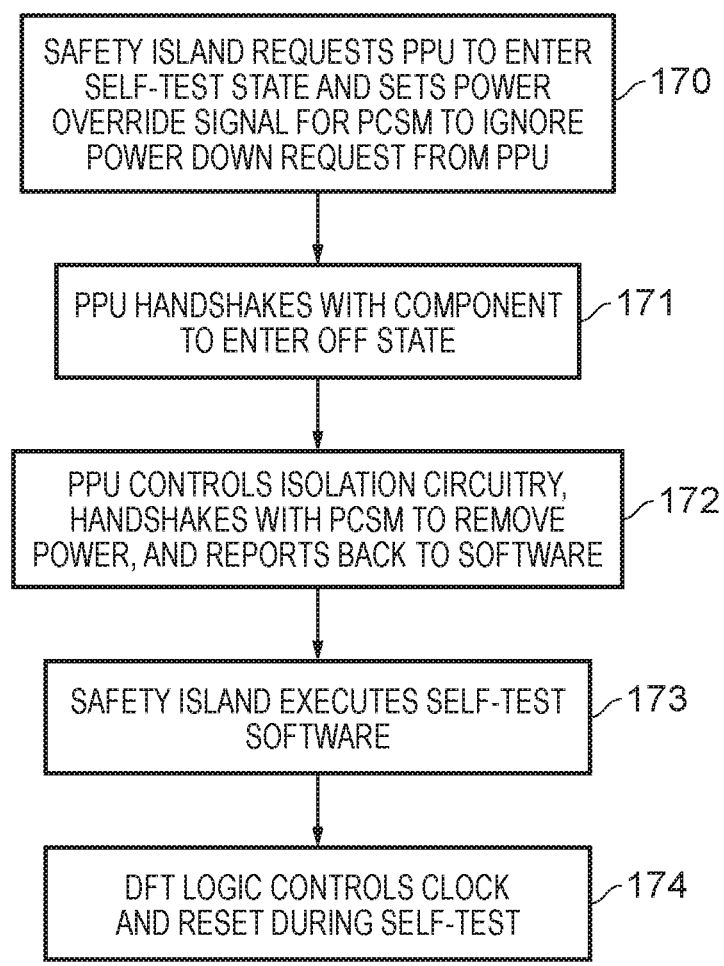
FIG. 10 is a flow diagram illustrating a sequence of steps which are taken according to the method of one embodiment when a self-test procedure is carried out with respect to functional circuitry such as the component in FIG. 9.

FIG. 10 is a flow diagram showing a sequence of steps which are taken in one embodiment, for example in the context of an apparatus such as the apparatus 150 shown in FIG. 9, when a self-test procedure is carried out. The procedure begins at step 170 where software (in this example running in the "safety island") requests the PPU to cause the component to enter a self-test state and sets a power override signal for the PCSM to cause it to ignore a power down request from the PPU. Then at step 171 the PPU handshakes with the component to (seek to) cause it to enter its OFF state in an orderly fashion. Then at step 172 the PPU controls isolation circuitry to isolate the component from the remainder of the apparatus and handshakes with the PCSM to remove power from the component. When this is done it reports back (via an interrupt) to the safety island software. With the power override signal set by the safety island, the PCSM in fact does not remove power from the component and power is maintained for the purposes of carrying out the self-test procedure. Hence at step 173 the safety island can then execute self-test software to cause the component to be tested. In support of this, at step 174, the DFT override logic intervenes to control clock and reset during the self-test. It should be noted that the clock signal and reset control which are exerted over the component during the self-test may differ from those which the component would be subjected to in normal operational state. For example, in a self-test state the component may be clocked at a different clock speed with respect to the normal clock exerted during normal operations. Similarly the reset state which is set for the component 151 once the self-test procedure is complete may, for example, be unique to completion of the self-test procedure.

Figure 11:
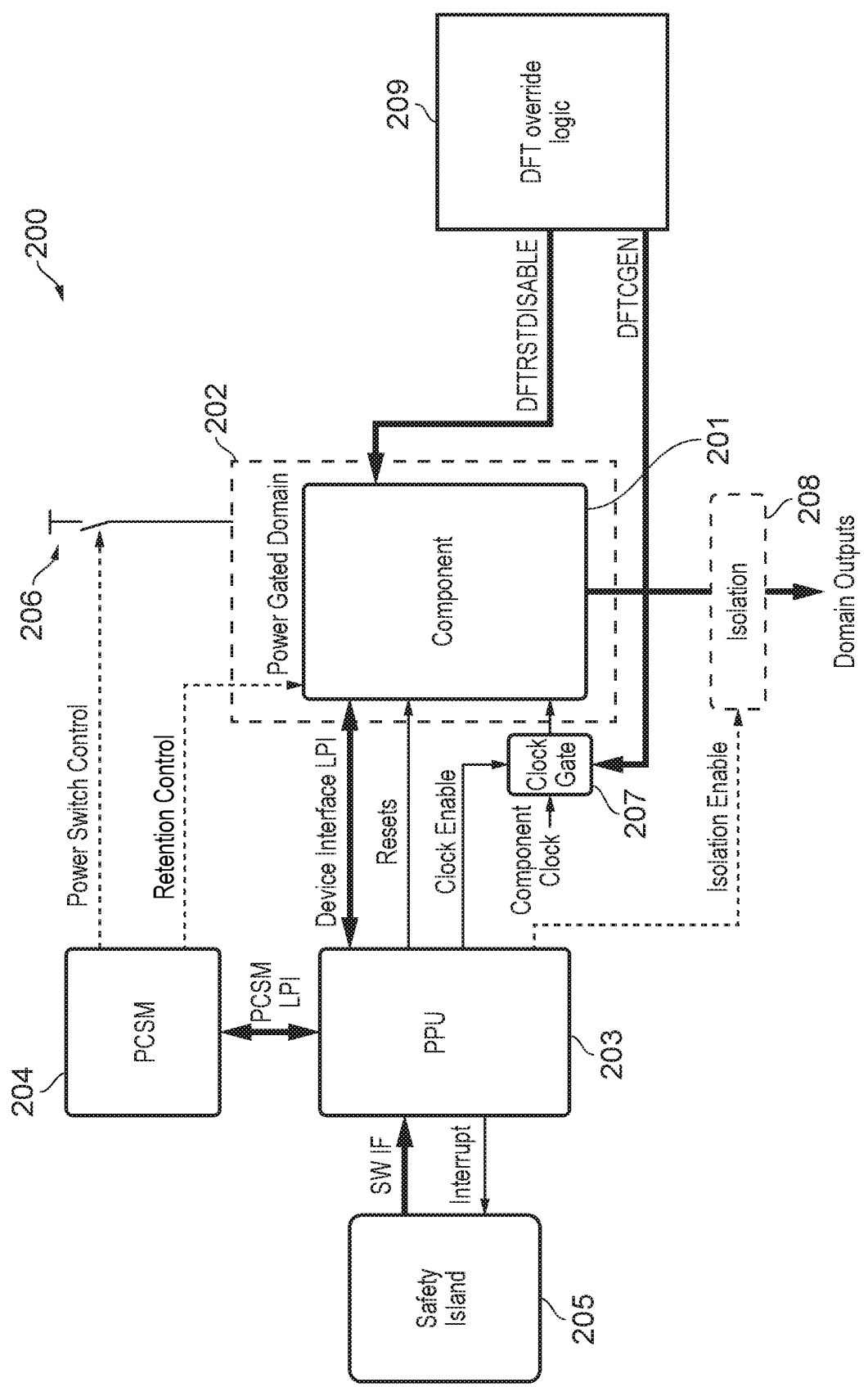
FIG. 11 schematically illustrates an apparatus in one embodiment in which a component within a power gated domain may be the subject of a self-test procedure under the control of self-test control circuitry, which interacts with a power control state machine and a power policy unit of the apparatus when the self-test procedure is carried out.

FIG. 11 schematically illustrates an apparatus 200 in a further example embodiment. The correspondence of components in FIG. 11 with those in the example embodiments of FIG. 7 and FIG. 9 with respect to the example apparatus 100 and the example apparatus 150 will be recognised. In this example embodiment however the PPU 203 is modified to recognise and act in accordance with a defined "BIST" mode. Thus, when the safety island 205 wishes to cause a self-test procedure to be carried out with respect to component 201 within the power gated domain 202, no override mechanisms (either hardware as in the case of FIG. 7 or software as in the case of FIG. 9) are required. Hence, for the apparatus 200 in FIG. 11, when the safety island 205 initiates the process to transition to self-test, this begins by the safety island interacting with the PPU 203 to request that the component is 201 is transitioned into the BIST state. The PPU 203 handshakes with the component 201 (via the device interface LPI) to cause this transition to be carried out in an orderly fashion. The PPU 203 then drives the Isolation Enable signal to cause the isolation circuitry 208 to isolate the component 201 from the remainder of the apparatus 200. Once this is complete, assuming that the request to enter the BIST state was received when the power gated domain was in its powered state, the PPU 203 can directly report back to the safety island software 205, since no power down handshake with the PCSM 204 is necessary, as power is maintained to the power gate domain 202 and hence for the component 201 for the purposes of the self-test procedure. Alternatively, when the request to enter the BIST state is received when the power gated domain is in a retention state, then the PPU 203 handshakes with the PCSM 204 (via the PCSM LPI) to power up the component 201. The safety island 205 then executes self-test software to cause the self-testing of the component 201 to be carried out. This may be supported by the DFT override logic 209, which can firstly exert the DFTRSTDISABLE signal, which disables reset for the component during the self-test, and secondly exert the DFTCGEN signal, which controls the clocking (via clock gate 207) of the component during the self-test. Alternatively the PPU may also control these aspects of the self-test, for example by causing a reset for a period to get the component 201 into a known state, and then release the reset. The DFT override logic 209 then only needs to handle the clock selection i.e. a functional or a test clock. The test clock may be a bespoke clock signal for the self-test. Once the self-test procedure is complete, the safety island 205 can signal to the PPU to indicate that component 201 is to be returned to a desired state, which may also be a bespoke state for exiting the self-test, but may be a standard state, e.g. that which it has when normally entering its operational ON mode.

Figure 12:
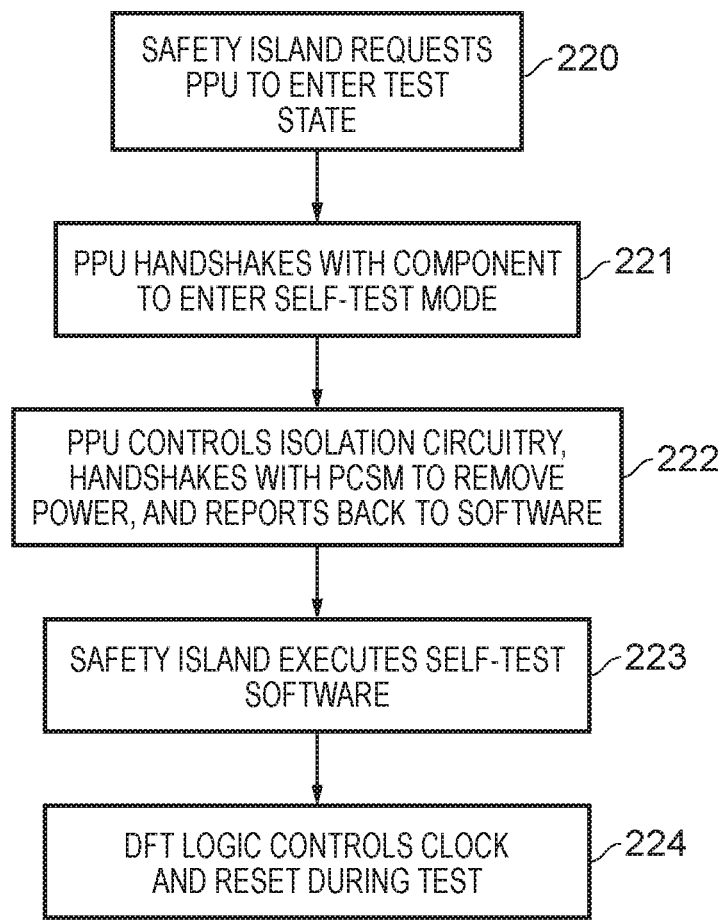
FIG. 12 is a flow diagram illustrating a sequence of steps which are taken according to the method of one embodiment when a self-test procedure is carried out with respect to functional circuitry such as the component in FIG. 11.

FIG. 12 is a flow diagram showing a sequence of steps which are taken in one embodiment, for example in the context of an apparatus such as the apparatus 200 shown in FIG. 11, when a self-test procedure is carried out. At step 220 the software (running in the "safety island") requests that the PPU causes the component to enter its test state. Then at step 221 the PPU handshakes with the component to enter its self-test mode and the PPU activates isolation circuitry to isolate the component from the remainder of the apparatus. Thus configured to be ready for self-test, the PPU then reports back to software executing in the "safety island" (e.g. by interrupt) at step 222. Then at step 223 the safety island (i.e. here the supporting processor) executes self-test software to cause self-testing of the component to be carried out and at step 224 DFT logic circuitry controls the clock and reset of the component during the self-test. Once the self-test is completed the safety island may for example cause the PPU to bring the component back to a normal operational state.

In brief overall summary, apparatuses and methods of controlling an apparatus are disclosed. An apparatus comprises a control domain comprising functional circuitry to perform logical operations when in an operational state, wherein the functional circuitry comprises at least one output and a state of the at least one output is dependent on the logical operations. Domain control circuitry controls the control domain to put the functional circuitry in one of the operational state and a non-operational state. Isolation circuitry isolates the functional circuitry within the apparatus by holding the state of the at least one output at a predetermined value when the domain control circuitry puts the functional circuitry in the non-operational state. Self-test control circuitry causes the domain control circuitry to control the control domain to put the functional circuitry in the non-operational state and to cause a self-test procedure to be carried out with respect to the functional circuitry.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope of the invention as defined by the appended claims. For example, various combinations of the features of the dependent claims could be made with the features of the independent claims without departing from the scope of the present invention.

We claim:

1. Apparatus comprising:
a control domain comprising functional circuitry to perform logical operations when in an operational state, wherein the functional circuitry comprises at least one output and a state of the at least one output is dependent on the logical operations;
domain control circuitry to control the control domain to put the functional circuitry in one of the operational state and a non-operational state;
isolation circuitry to isolate the functional circuitry within the apparatus by holding the state of the at least one output at a predetermined value when the domain control circuitry puts the functional circuitry in the non-operational state;
self-test control circuitry to cause the domain control circuitry to control the control domain to put the functional circuitry in the non-operational state and to cause a self-test procedure to be carried out with respect to the functional circuitry,
wherein the control domain comprises a power domain,
wherein the domain control circuitry comprises a power control state machine to set a power switch control signal to control the power domain, wherein the power control state machine is responsive to a power state signal to assert a first value of the power switch control signal to cause power to be provided to the functional circuitry when in the operational state and to assert a second value of the power switch control signal to cause power to be withheld from the functional circuitry when in the non-operational state.

2. The apparatus as claimed in claim 1, further comprising power control override circuitry to assert a power override signal which overrides the power switch control signal in control of the power domain, wherein in the self-test procedure the power control override circuitry asserts the power override signal such that power is provided to the functional circuitry regardless of the value of the power switch control signal asserted by the power control state machine.

3. The apparatus as claimed in claim 1, further comprising power policy circuitry to control the power control state machine and to control elements of the functional circuitry, and the power policy circuitry is responsive to a self-test trigger indicating that the self-test procedure should be carried out to control the isolation circuitry to isolate the functional circuitry within the apparatus by holding the state of the at least one output at the predetermined value and to control the elements of the functional circuitry to participate in the self-test procedure.

4. The apparatus as claimed in claim 3, wherein the elements of the functional circuitry comprise a clock control for the functional circuitry and at least one reset for the functional circuitry.

5. The apparatus as claimed in claim 1, wherein the domain control circuitry comprises modified power domain control circuitry responsive to the self-test control circuitry to control the control domain to put the functional circuitry in the non-operational state as part of the self-test procedure.

6. The apparatus as claimed in claim 1, wherein the self-test control circuitry is capable of controlling elements of the functional circuitry to participate in the self-test procedure.

7. The apparatus as claimed in claim 6, wherein the elements of the functional circuitry comprise a clock control for the functional circuitry and at least one reset for the functional circuitry.

8. The apparatus as claimed in claim 7, wherein the self-test control circuitry is capable of controlling the clock control for the functional circuitry to apply a self-test clock signal in the self-test procedure which is different to a functional clock signal used when the functional circuitry is in the operational state.

9. The apparatus as claimed in claim 7, wherein the self-test control circuitry is capable of controlling the reset for the functional circuitry to initialise the functional circuitry into a predetermined state after the self-test procedure is complete.

10. The apparatus as claimed in claim 1, wherein the self-test control circuitry comprises a finite state machine which controls the self-test procedure.

11. The apparatus as claimed in claim 1, wherein the self-test control circuitry comprises a processing element arranged to execute software which controls the self-test procedure.

12. The apparatus as claimed in claim 1, wherein the domain control circuitry is responsive to a self-test trigger to control the control domain to put the functional circuitry in the non-operational state and to cause a self-test procedure to be carried out with respect to the functional circuitry.

13. The apparatus as claimed in claim 12, wherein the self-test trigger comprises at least one of:
an indication that the apparatus is powering on or off;
an indication that the apparatus is booting up;
an indication that a self-test timer has elapsed; and
an indication that a predetermined event has occurred.

14. The apparatus as claimed in claim 1, wherein the control domain comprises a reset domain.

15. The apparatus as claimed in claim 1, wherein the control domain comprises a clock domain.

16. A method of controlling an apparatus comprising:
performing logical operations in functional circuitry of a control domain of the apparatus when the functional circuitry in an operational state, wherein the functional circuitry comprises at least one output and a state of the at least one output is dependent on the logical operations;
controlling the control domain to put the functional circuitry in one of the operational state and a non-operational state;
isolating the functional circuitry within the apparatus by holding the state of the at least one output at a predetermined value when the functional circuitry is in the non-operational state;
causing the domain control circuitry to control the control domain to put the functional circuitry in the non-operational state and to cause a self-test procedure to be carried out with respect to the functional circuitry,
wherein the control domain comprises a power domain,
wherein controlling the control domain comprises setting a power switch control signal to control the power domain, and responsive to a power state signal, asserting a first value of the power switch control signal to cause power to be provided to the functional circuitry when in the operational state and asserting a second value of the power switch control signal to cause power to be withheld from the functional circuitry when in the non-operational state.

17. The method of claim 16, wherein the method is carried out during runtime of the apparatus.

18. The method of claim 16, wherein the method is carried out at a manufacture of the apparatus.

* * * * *